US012777961B2

(12) United States Patent
Park et al.

(10) Patent No.: US 12,777,961 B2
(45) Date of Patent: Oct. 27, 2026

(54) ELECTRONIC DEVICES AND METHODS OF MANUFACTURING ELECTRONIC DEVICES

(71) Applicant: Amkor Technology Singapore Holding Pte. Ltd., Valley Point (SG)

(72) Inventors: Dae Young Park, Jeollanam-do (KR); Hyeong Il Jeon, Gyeonggi-do (KR); Gi Jeong Kim, Gyeonggi-do (KR); Ji Yeon Yang, Gyeonggi-do (KR); Kwang Soo Sang, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 315 days.

(21) Appl. No.: 18/661,405

(22) Filed: May 10, 2024

(65) Prior Publication Data

US 2025/0349638 A1 Nov. 13, 2025

(51) Int. Cl.

| | |
|---|---|
| ***H10W 74/10*** | (2026.01) |
| ***H10W 72/00*** | (2026.01) |
| ***H10W 74/00*** | (2026.01) |
| ***H10W 90/00*** | (2026.01) |

(52) U.S. Cl.

CPC ........ *H10W 74/114* (2026.01); *H10W 90/701* (2026.01); *H10W 72/07331* (2026.01); *H10W 74/00* (2026.01); *H10W 90/736* (2026.01)

(58) Field of Classification Search

None

See application file for complete search history.

(56) References Cited

U.S. PATENT DOCUMENTS

2011/0070697 A1* 3/2011 Tsai ........................ H10W 90/00 438/109
2012/0182706 A1* 7/2012 Siomkos ............... H10W 42/20 361/803
2012/0267782 A1* 10/2012 Chen ................... H10W 42/121 257/738
2016/0005707 A1* 1/2016 Kwon ................. H10W 70/687 257/737
2023/0068223 A1* 3/2023 Nuotio .................... H02M 1/08

* cited by examiner

*Primary Examiner* — Khaja Ahmad
(74) *Attorney, Agent, or Firm* — Kevin B. Jackson

(57) ABSTRACT

An electronic device includes an embedded module including a module component comprising a first terminal and a second terminal. A first module substrate is coupled to the first terminal with a first bonding layer and a second module substrate is coupled to the second component terminal with a second bonding layer. A module encapsulant covers the module component and the first and second module substrates. A first device substrate is coupled to the first module substrate and a second device substrate is coupled to the second module substrate. Device terminals are coupled to the module component and a device encapsulant covers the embedded module, the device terminals, and the first and second device substrates. The first bonding layer includes a first sintering material, the second bonding layer includes a second sintering material, and portions of the first device substrate and the device terminals are exposed from the device encapsulant.

20 Claims, 14 Drawing Sheets

ELECTRONIC DEVICES AND METHODS OF MANUFACTURING ELECTRONIC DEVICES

CROSS-REFERENCE TO RELATED APPLICATIONS

Not applicable.

TECHNICAL FIELD

The present disclosure relates, in general, to electronic devices, and more particularly, to electronic devices and methods for manufacturing electronic devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1A:
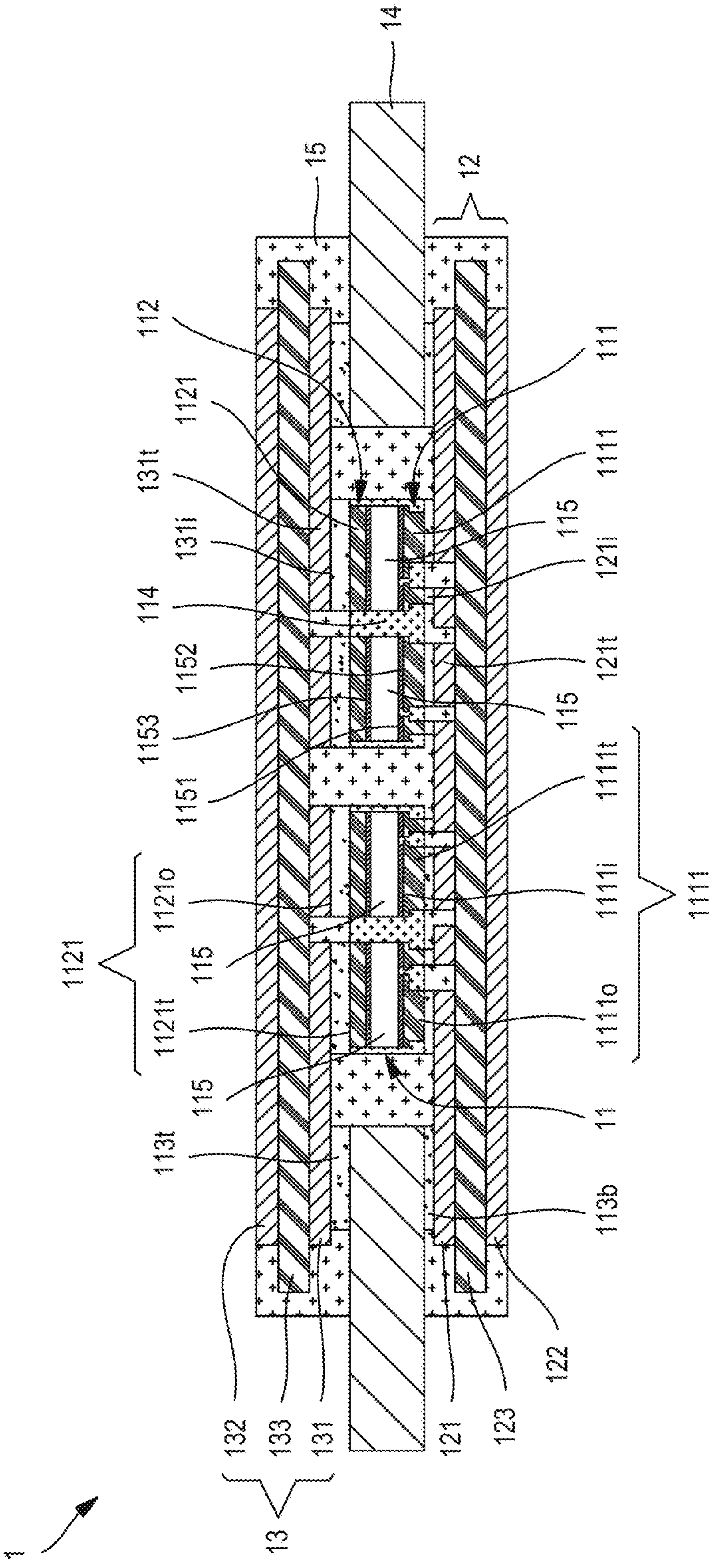
FIG. 1A shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

The present description includes, among other features, structures and associated methods that relate to electronic devices with embedded modules and heat transfer or cooling structures. In some examples, the electronic device includes an embedded module with module components attached to module substrates without the use of or with a reduced number of spacers when manufactured in a multiple module substrate matrix format. In some examples, the avoidance or reduction in use of spacers is facilitated by an attachment process that reduces the movement of the module substrates during bonding. In some examples, a sintering material comprising a solder material and metal particles is used for the attachment process, which was found through experimentation to maintain a more uniform bond thickness and planarity during sintering compared to prior reflow processes. By eliminating or reducing the use of spacers, higher density packaging can be achieved, manufacturing costs are reduced, manufacturing cycle time and efficiencies are improved, and higher power densities are achieved. In some examples, the module substrates are coupled to device terminals and conductive substrates are coupled to opposing sides of the embedded module. In some examples, the device terminals can comprise a leadframe. In some examples, the conductive substrates can be thermally conductive. In some examples, the conductive substrates can be thermally and electrically conducting.

In an example, an electronic device includes a first embedded module including a first module component comprising a first module component first side, a first module component second side opposite to the first module component first side, a first module component lateral side, a first component terminal adjacent to the first module component first side, and a second component terminal adjacent to the first module component second side; a first module substrate coupled to the first component terminal with a first bonding layer; a second module substrate coupled to the second component terminal with a second bonding layer; and a first module encapsulant encapsulating the first module component, portions of the first module substrate, and portions of the second module substrate. A first device substrate is coupled to the first module substrate and a second device substrate is coupled to the second module substrate. Device terminals are coupled to the first module component, and a device encapsulant encapsulates the first embedded module, the device terminals, the first device substrate, and the second device substrate. In the present example, the first bonding layer comprises a first sintering material, the second bonding layer comprises a second sintering material, a portion of the first device substrate is exposed from the device encapsulant, and portions of the device terminals are exposed from the device encapsulant.

In an example, an electronic device includes an embedded module including a first module component with a first module component first side, a first module component second side opposite to the first module component first side, a first component lateral side, a first component terminal adjacent to the first module component first side, and a second component terminal adjacent to the first module component second side. A first lead frame substrate is coupled to the first component terminal with a first bonding layer. A second lead frame substrate is coupled to the second component terminal with a second bonding layer. A module encapsulant encapsulating the first module component, portions of the first lead frame substrate, and portions of second lead frame substrate. A first device substrate is coupled to the first lead frame substrate and a second device substrate coupled to the second lead frame substrate. Device terminals are coupled to the first module component and a device encapsulant encapsulating the embedded module, the device terminals, the first device substrate, the second device substrate. In the present example, the first bonding layer comprises a first sintering material comprising a first solder material and first metal particles.

In an example, a method of manufacturing an electronic device includes providing an embedded module including a first module component comprising a first module component first side, a first module component second side opposite to the first module component first side, a first component lateral side, a first component terminal adjacent to the first module component first side, and a second component terminal adjacent to the first module component second side; a first lead frame substrate coupled to the first component terminal with a first bonding layer; a second lead frame substrate coupled to the second component terminal with a second bonding layer; and a module encapsulant encapsulating the first module component, portions of the first lead frame substrate, and portions of second lead frame substrate. The method includes providing a first device substrate coupled to the first lead frame substrate. The method includes providing a second device substrate coupled to the second lead frame substrate. The method includes providing device terminals coupled to the first module component. The method includes providing a device encapsulant encapsulating the embedded module, the device terminals, the first device substrate, the second device substrate. In present example, the first bonding layer comprises a first sintering.

Other examples are included in the present disclosure. Such examples may be found in the figures, in the claims, or in the description of the present disclosure.

Figure 1B:
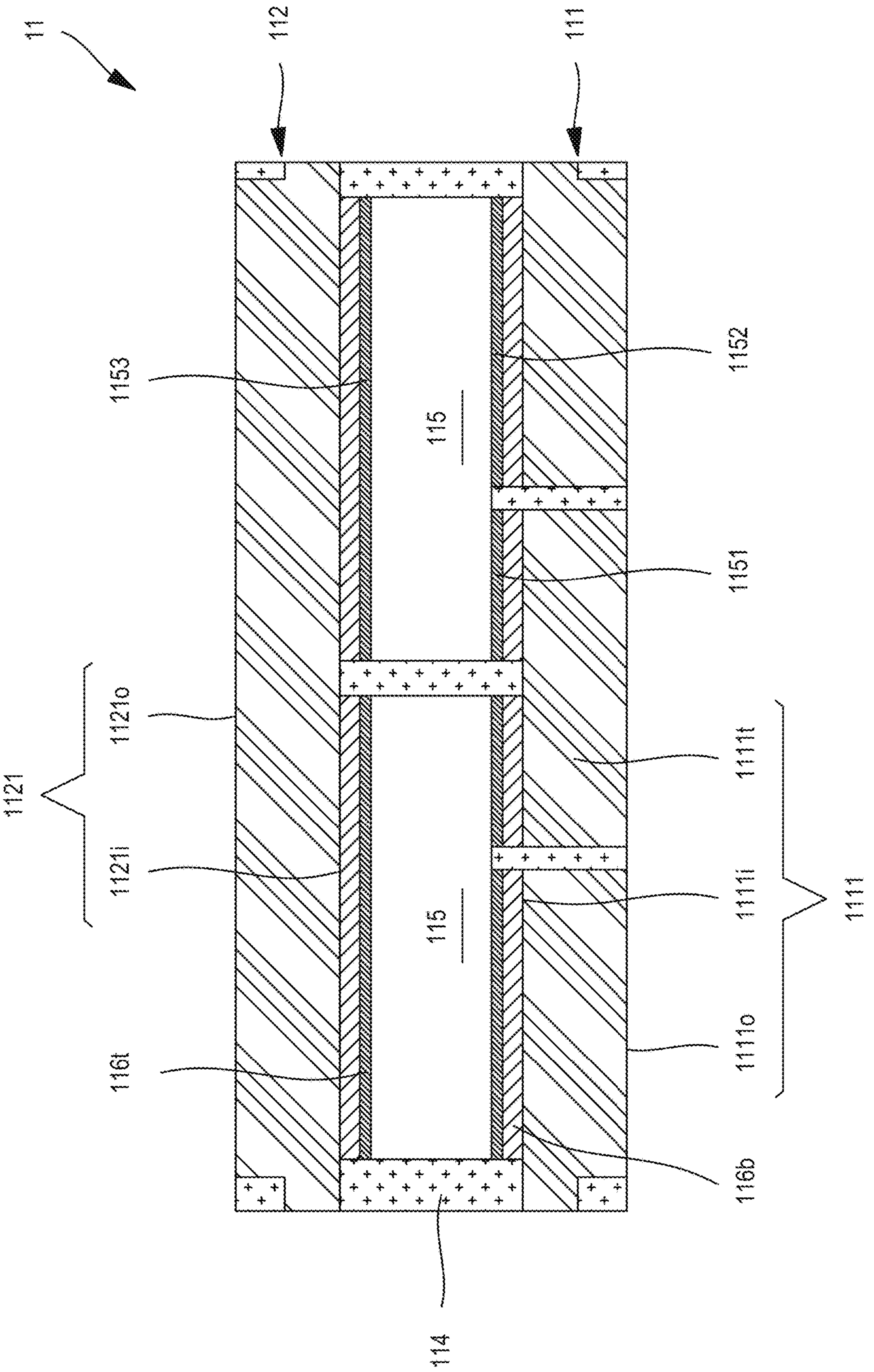
FIG. 1B shows a cross-sectional view of an example embedded module in the electronic device.

FIG. 1A shows a cross-sectional view of an example electronic device 1, and FIG. 1B shows a cross-sectional view of an example embedded module 11 in electronic device 1. In the example shown in FIGS. 1A and 1B, electronic device 1 can comprise embedded modules 11, device substrates 12 and 13, device terminals 14, and device encapsulant 15.

Embedded module 11 can comprise first module substrate 111, second module substrate 112, module encapsulant 114, and module components 115. First module substrate 111 can comprise conductive structure 1111. In some examples, conductive structure 1111 can comprise inward terminals 1111*i*, outward terminals 1111*o*, and traces 1111*t*. Second module substrate 112 can comprise conductive structure 1121. Conductive structure 1121 can comprise inward terminals 1121*i* and outward terminals 1121*o*. In some examples, each of module components 115 can comprise component terminals 1151, 1152, and 1153.

Embedded module 11 can further comprise bonding layer 116*b* that couples module components 115 to first module substrate 111. Embedded module 11 can further comprise bonding layer 116*t* that couples second module substrate 112 to module components 115. Bonding layer 116*b* can comprise or be referred to as a bottom side bonding layer and bonding layer 116*t* can comprise or be referred to as a top side bonding layer.

First module substrate 111, second module substrate 112, and module encapsulant 114 can comprise or be referred to as an electronic package, a semiconductor package or a package. The electronic package provides protection for module components 115 from exposure to external elements or the environment. The electronic package can also provide coupling between module components 115 and external components or other electronic packages.

Device substrate 12 can comprise inward metallic layer 121, outward metallic layer 122, and core layer 123. Inward metallic layer 121 can comprise inward terminals 121*i* and traces 121*t*. Device substrate 13 can comprise inward metallic layer 131, outward metallic layer 132, and core layer 133. Inward metallic layer 131 can comprise inward terminals 131*i* and traces 131*t*.

Electronic device 1 can further comprise conductive adhesive 113*b* that electrically connects device terminals 14 to device substrate 12. Electronic device 1 can further comprise conductive adhesive 113*t* that electrically connects device substrate 13 to device terminals 14. Conductive adhesive 113*b* can comprise or be referred to as a bottom side conductive adhesive and conductive adhesive 113*t* can comprise or be referred to as a top side conductive adhesive.

Device substrates 12 and 13, device terminals 14, and device encapsulant 15 can comprise or be referred to as an electronic package, semiconductor package, or a package. The electronic package provides protection for embedded module 11 from exposure to external elements or the environment. The electronic package can also provide electrical coupling between external electronic components and embedded module 11.

Figure 2A:
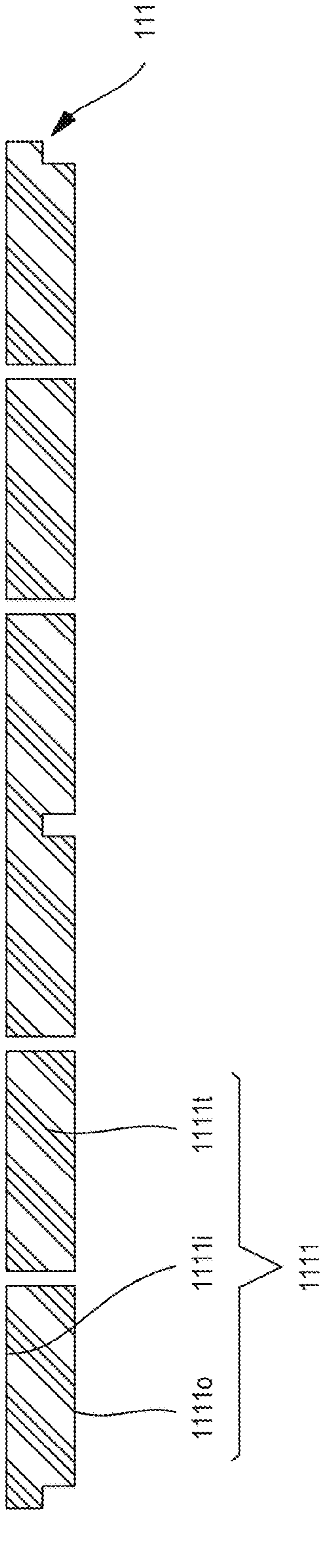
FIGS. 2A, 2B, 2C, 2D, 2E, 2F, 2G, and 2H show cross-sectional views of an example method for manufacturing an example embedded module.

FIGS. 2A, 2B, 2C, 2D, 2E, 2F, 2G, and 2H show cross-sectional views of an example method for manufacturing an example embedded module, such as embedded module 11 of FIGS. 1A and 1B. FIG. 2A shows a cross-sectional view of embedded module 11 at an early stage of manufacture.

In the example shown in FIG. 2A, first module substrate 111 can be provided. In some examples, first module substrate 111 can comprise or be referred to as a lead frame substrate, a regular laminate substrate, a molded substrate, a saw micro-lead frame (sMLF), a punch and saw MLF, or a routable micro-lead frame (rtMLF). In some examples, first module substrate 111 can comprise copper, a copper alloy, nickel, a nickel alloy, iron, an iron-nickel alloy, or a tin-copper alloy. In some examples, a method for manufacturing first module substrate 111 can comprise a stamping method or an etching method. As an example, in the stamping method, a lead frame can be manufactured by punching or sawing conductive structure 1111 while being sequentially transferred by a sequential transfer type press mold device. As an example, in the etching method, lead frame can be manufactured by chemically etching the conductive structure 1111. In some examples, the etching process can comprise dry etching (e.g., plasma etching, reactive ion etching (RIE), or sputter etching) or wet etching (e.g., immersion and spraying). As a result of the manufacturing method, conductive structure 1111 can comprise conductive paths, leads, terminals, pads, traces, or vias. In some examples, the conductive structure 1111 can comprise inward terminals 1111*i* provided substantially in the upper area, outward terminals 1111*o* provided substantially in the lower area, and traces 1111*t* connecting inward terminals 1111*i* and outward terminals 1111*o*. The thickness of first module substrate 111 can range from about 125 micrometers (microns) to about 250 microns. In some examples, first module substrate 111 can provide a current flow path between module components 115 and device substrate 12 (FIG. 1).

Figure 2B:
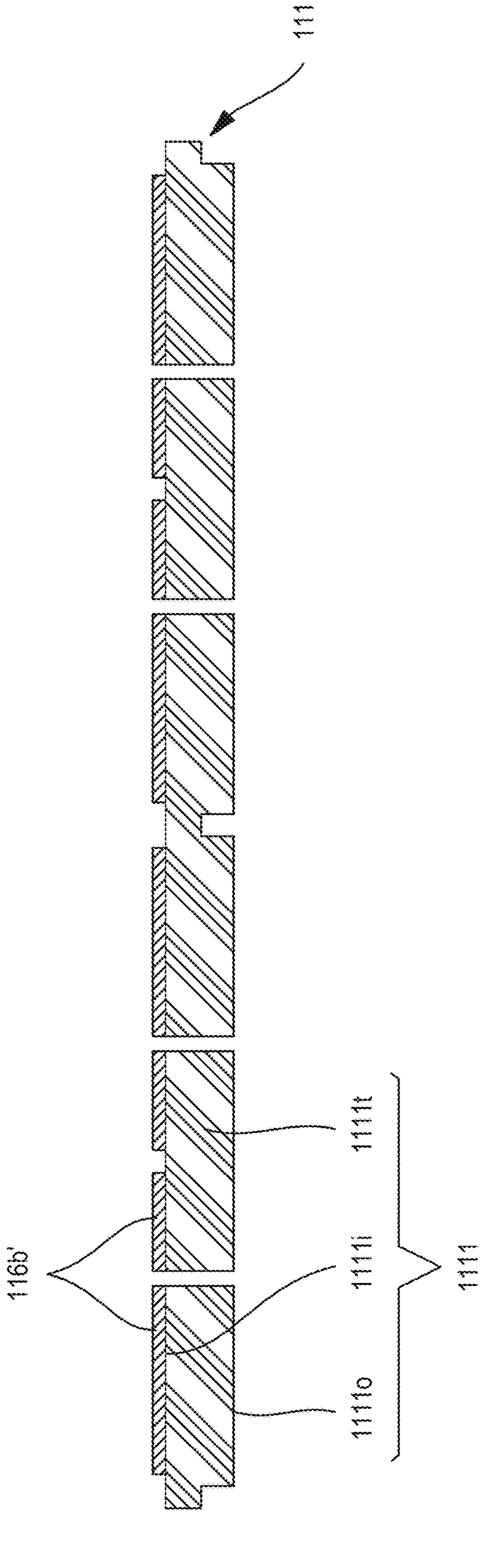

FIG. 2B shows a cross-sectional view of embedded module 11 at a later stage of manufacture. In the example shown in FIG. 2B, bottom side sintering material 116*b*' can be provided. In some examples, bottom side sintering material 116*b*' can comprise or be referred to as a bonding material, a sintered material, a sintering material, or a sintering structure. In the example shown in FIG. 2B, bottom side sintering material 116*b*' can be provided on or adjacent to inward terminal 1111*i*. Bottom side sintering material 116*b*' can be provided on inward terminals 1111*i* by coating methods, such as doctor blade coating, casting, painting, spray coating, slot die coating, curtain coating, slide coating or knife over edge coating, printing methods such as screen printing, pad printing or gravure printing, using an intermediate technology between coating and printing, such as flexographic printing, offset printing or inkjet printing, or directly attaching a conductive adhesive film or a conductive adhesive tape. In some examples, bottom side sintering material 116*b*' can include a sintering paste, a sintering film, or a sintering tape including sinterable metal particles and a solder material that can be melted at a lower temperature than the metal particles.

In some examples, the metal particles can comprise a solderless material. In some examples, the metal particles can comprise silver, gold, copper, nickel, or aluminum particles. In some examples, the metal particles can comprise nanoscale or microscale particles. In some examples, the particle size of the metal particles can range from about 1 nanometer (nm) to about 10 microns. In some examples, the metal particles can have a particle diameter of greater than about 10 microns. In some examples, the solder material can comprise Sn-based solder, Pb-based solder, or Au-based solder. In some examples, the Sn-based solder (lead-free solder) can comprise pure Sn, Sn—Ag, Sn—Ag—Cu, or Sn—Cu. In some examples, the Pb-based solder (lead solder) can comprise Sn—Pb. In some examples, the Au-based solder (hard solder) can comprise Au—Sn. The solder material can comprise Sn as a main constituent material. In some examples, the content of Sn in the solder material can be greater than about 90 wt %. However, the specific composition and composition ratio of the solder material may vary in accordance with predetermined specifications.

In some examples, when the sintering material comprises a mixed paste, and the content ratio (weight ratio) of the solder material and the metal particles may be greater than about 1:2.5. In some examples, the content ratio (weight ratio) of the solder material and the metal particles in the mixed paste can range from about 1:3 to about 1:10. When the content (wt %) of the metal particles is greater than 2.5 times or about 3 times than the content (wt %) of the solder material, an intermetallic can be easily formed through the reaction therebetween. Depending on the type of solder material and metal particles and the type of intermetallic compound, the content ratio of the solder material and metal particles can vary. In some examples, the mixed paste can further comprise a binder or a solvent in addition to the metal particles and solder material. The thickness of the sintering material, that is, the mixed paste, applied on inward terminals 1111*i* can range from about 10 microns to about 100 microns. In some examples, the thickness of the sintering material can range from about 15 microns to about 30 microns. The sintering material or the mixed paste can temporarily attach component terminals 1151 and 1152 (FIG. 1B) of module components 115 onto inward terminals 1111*i* of first module substrate 111.

Figure 2C:
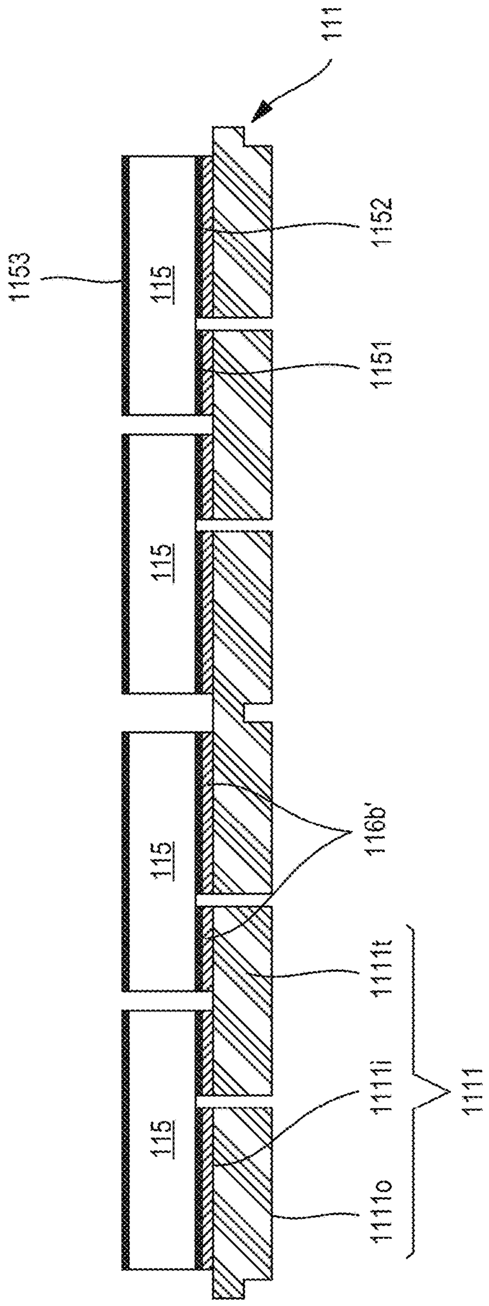

FIG. 2C shows a cross-sectional view of embedded module 11 at a later stage of manufacture. In the example shown in FIG. 2C, module components 115 can be provided. In the example shown in FIG. 2C, module components 115 can be provided on first module substrate 111. In some examples, module components 115 can comprise or be referred to as power components, power devices, metal-oxide semiconductor field-effect transistors (MOSFETs), insulated gate bipolar transistors (IGBTs), diodes, thyristors, transistors, semiconductor dies, semiconductor chips, or semiconductor packages. In some examples, module components 115 can comprise component terminals 1151, 1152, and 1153. Component terminals 1151 and 1152 of module components 115 can be positioned on the sintering material 116*b*' provided on inward terminals 1111*i* of first module substrate 111. The thickness of module components 115 can range from about 55 microns to about 250 microns. In some examples, the thickness of component terminals 1151, 1152, and 1153 can range from about 0.68 microns to about 6.55 microns. In some examples, module components 115 can be configured as power supply components. In some examples, module components 115 can stably switch power of tens to hundreds of volts or tens of amperes.

In accordance with various examples, module components 115 are then coupled to first module substrate 111. In some examples, a sintering process can be performed to couple module components 115 (e.g., component terminals 1151 and 1152) to inward terminals 1111*i* of first module substrate 111. In some examples, the sintering process can be performed with component terminals 1151 and 1152 temporarily in contact with the mixed paste provided on inward terminals 1111*i* of first module substrate 111. The sintering process can include a heating process. In some examples, a temperature above the melting point of the solder material of the mixed paste can be provided to perform a sintering process for the metal particles and a soldering process for the solder material simultaneously within the mixed paste. Through this, the metal particles can be sintered and at the same time, the metal particles and the solder material can react to form an intermetallic compound. In some examples, the heating temperature or elevated temperature in the sintering process can range from about 150° C. to about 300° C. In some examples, the bonding process can be performed in a state where it is not necessary to press module components 115 on first module substrate 111 in the temperature range stated above.

Through this sintering process, bottom side bonding layer 116*b* can be formed between module components 115 and first module substrate 111. In some examples, bottom side bonding layer 116*b* can comprise or be referred to as a bonding structure or an attachment structure. In some examples, bottom side bonding layer 116*b* can be provided between component terminals 1151 and 1152 and inward terminals 1111*i* of first module substrate 111, thereby electrically connecting component terminals 1151 and 1152 to inward terminals 1111*i* of first module substrate 111. Bottom side bonding layer 116*b* can comprise an intermetallic compound formed by a reaction between the metal particles and the solder material. In some examples, when the metal particles include Ag particles and the solder material includes Sn, the reaction therebetween can form $Ag_3Sn$. The content of the intermetallic compound in bottom side bonding layer 116*b* can be higher than about 50 weight percent (wt %) or about 60 wt %. The intermetallic compound can be uniformly or relatively uniformly distributed throughout bottom side bonding layer 116*b*. In some examples, the final thickness of bottom side bonding layer 116*b* can range from about 10 microns to about 100 microns. In some examples, the final thickness of bottom side bonding layer 116*b* can range from about 15 microns to about 30 microns.

Figure 2D:
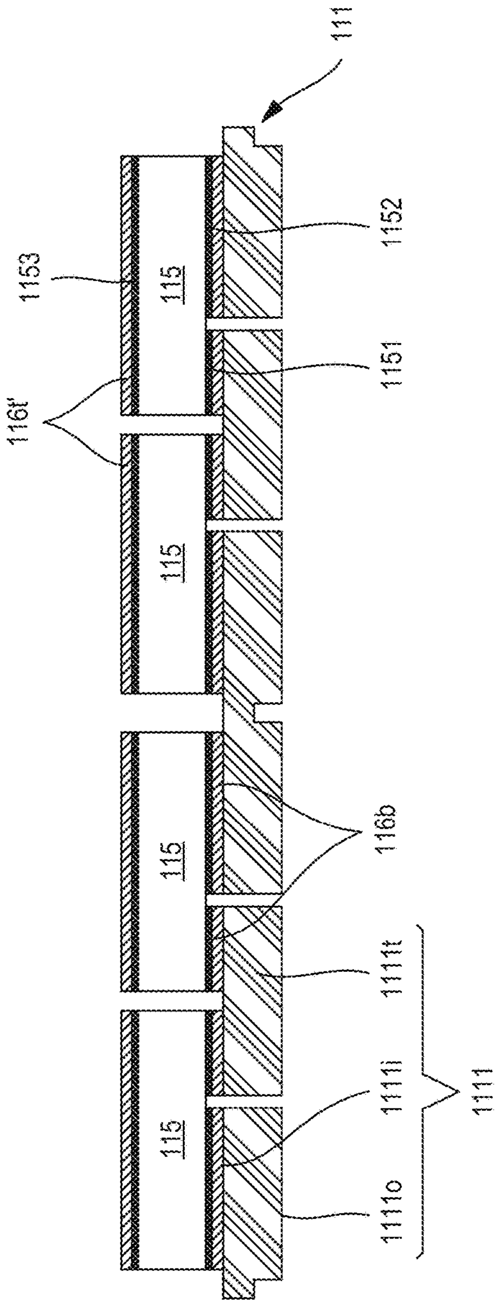

FIG. 2D shows a cross-sectional view of embedded module 11 at a later stage of manufacture. In the example shown in FIG. 2D, top side sintering material 116*t*' (e.g., mixed paste) can be provided. In some examples, top side sintering material 116*b*' can comprise or be referred to as a bonding material, a sintering material or a sintering structure. In the example shown in FIG. 2E, top side sintering material 116*t*' can be provided on component terminals 1153 of module components 115. Top side sintering material 116*t*' can be provided on component terminals 1153 by coating methods such as doctor blade coating, casting, painting, spray coating, slot die coating, curtain coating, slide coating or knife over edge coating, printing methods such as screen printing, pad printing or gravure printing, using an intermediate technology between coating and printing, such as flexographic printing, offset printing or inkjet printing, or directly attaching a conductive adhesive film or a conductive adhesive tape. In some examples, similar to bottom side sintering material 116*b*', top side sintering material 116*t*' can also comprise a sintering paste, a sintering film, or a sintering tape including sinterable metal particles and a solder material. In accordance with the present description, top side sintering material 116*t*' can be melted at a lower temperature than the metal particles. The thickness of the sintering material applied on component terminal 1153, that is, mixed paste 116*t*', can also range from about 10 microns to about 100 microns. In some examples, the thickness of sintering material 116*t*' can range from about 15 microns to about 30 microns. The sintering material or mixed paste 116*t*' can temporarily attach second module substrate 112 onto component terminal 1153. In some examples, the material and properties of top side sintering material 116*t*' can be similar as the material and properties of bottom side sintering material 116*b*' described previously.

Figure 2E:
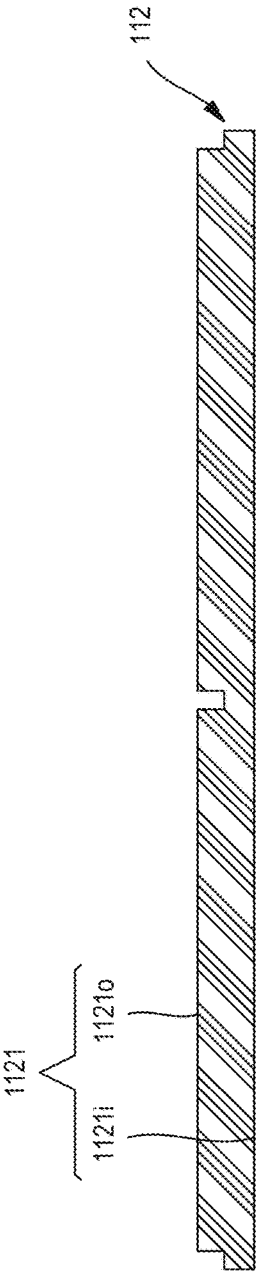

FIG. 2E shows a cross-sectional view of embedded module 11 at a later stage of manufacture. In the example shown in FIG. 2E, second module substrate 112 can be provided. In some examples, second module substrate 112 can comprise or be referred to as a lead frame substrate, a regular laminate substrate, a molded substrate, sMLF, punch and saw MLF, or rtMLF. In some examples, second module substrate 112 can comprise copper, a copper alloy, nickel, a nickel alloy, iron, an iron-nickel alloy, or a tin-copper alloy. In some examples, the material, thickness, and shape of second module substrate 112 can be similar to the material, thickness, and shape of first module substrate 111. Second module substrate 112 can comprise conductive structure 1121. Conductive structure 1121 can comprise conductive paths, leads, terminals, pads, traces, or vias. In some examples, conductive structure 1121 can comprise inward terminals 1121*i* provided roughly in the lower area and outward terminals 1121*o* provided roughly in the upper area. The thickness of second module substrate 112 can range from about 125 microns to about 250 microns. Second module substrate 112 can provide a current flow path between module components 115 and device substrate 13 (FIG. 1).

Figure 2F:
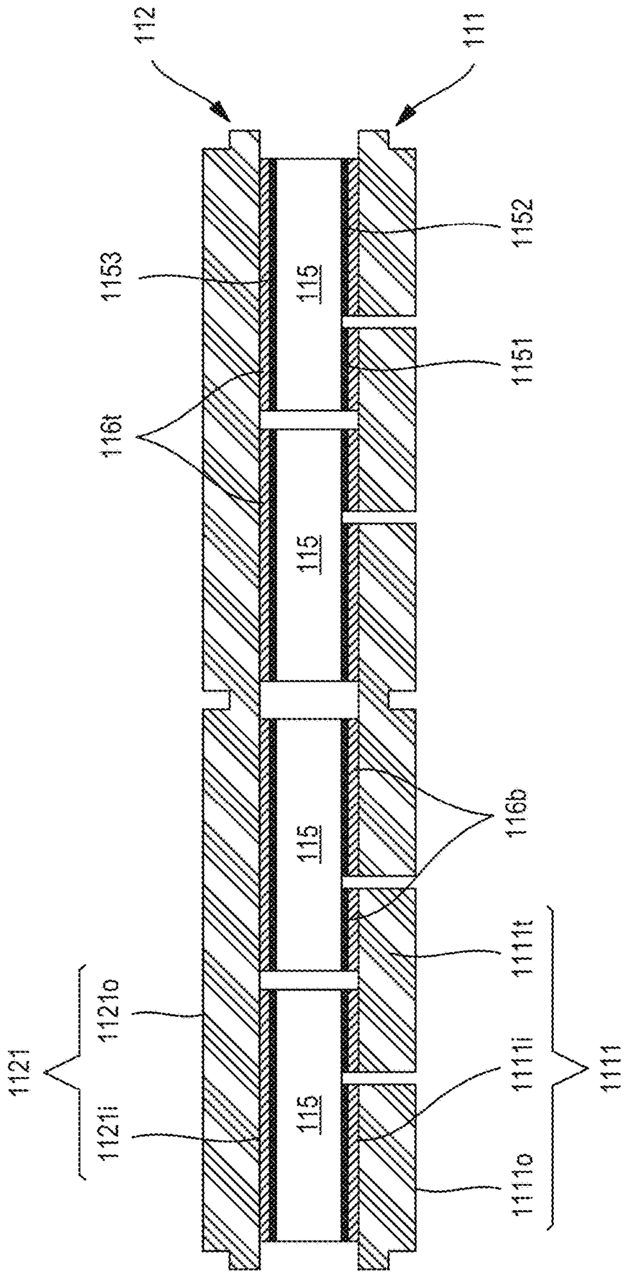

FIG. 2F shows a cross-sectional view of embedded module 11 at a later stage of manufacture. In the example shown in FIG. 2F, second module substrate 112 can be provided on and coupled to module components 115. In some examples, a sintering process can be performed to couple module components 115 (e.g., component terminal 1153) to inward terminal 1121*i* of second module substrate 112. For example, inward terminals 1121*i* of second module substrate 112 can be placed on component terminals 1153 of module components 115 through a sintering material, and a sintering process can then be performed. The sintering process can be similar to or the same as the sintering process described above with reference to FIG. 2C.

In some examples, a temperature above the melting point of the solder material of the sintering material can be provided to perform a sintering process for the metal particles and a soldering process for the solder material simultaneously within the sintering material. By this process, the metal particles can be sintered and at the same time, the metal particles and the solder material can react to form an intermetallic compound. In some examples, the heating temperature in the sintering process can range from about 150° C. to about 300° C. In some examples, the bonding process can be performed in a state where it is not necessary to press module components 115 on second module substrate 112 in the temperature range stated above.

Through this sintering process, top side bonding layer 116*t* can be formed between second module substrate 112 and module components 115. In some examples, top side bonding layer 116*t* can comprise or be referred to as a bonding structure or an attachment structure. In some examples, top side bonding layer 116*t* can be provided between inward terminals 1112*i* of second module substrate 112 and component terminals 1153, thereby electrically connecting inward terminals 1112*i* of second module substrate 112 to component terminals 1153. Top side bonding layer 116*t* can comprise an intermetallic compound formed by a reaction between the metal particles and the solder material. The final thickness of top side bonding layer 116*t* can range from about 10 microns to about 100 microns. In some examples, the final thickness of top side bonding layer 116*t* can range from about 15 microns to about 30 microns.

While it has been described above where a bottom side sintering process for forming bottom side bonding layer 116*b* and a top side sintering process for forming top side bonding layer 116*t* are each performed separately, the bottom side sintering process and the top side sintering process can also be performed at once. In some examples, after placing module components 115 on bottom side sintering material 116*b*' on first module substrate 111 without performing a sintering process. Subsequently, top side sintering material 116*t*' can be provided on module components 115 or second module substrate 112, and second module substrate 112 can be placed on module components 115. Next, a sintering process for bottom side sintering material 116*b*' and top side sintering material 116*t*' can be simultaneously performed. Accordingly, through these simultaneous sintering processes, the bottom side bonding layer 116*b* and the top side bonding layer 116*t* can be provided simultaneously.

In this way, by using a sintering process in accordance with the present description, instead of a traditional reflow process, precise thickness control is possible while a bonding layer is formed from a sintering material or mixed paste. In practice, while the bonding layer is formed from the mixed paste, there is minimal or almost no change in thickness. In comparison, when traditional reflow materials are used, a process of pressing the module component or second module substrate is involved to improve bonding properties (bondability), resulting in lateral spreading of the reflow material and making it difficult to precisely control the thickness. As a result, when a second module substrate is attached to module components, spacers (e.g., copper core balls) had to be placed around the module components, thereby suppressing a decrease in the thickness of the bonding layer. Thus, spacers, which were not part of the device operation were conventionally placed around module components, and after completion of an embedded module, a process of removing the spacers was involved, making the manufacturing process complicated and resulting in larger footprints.

While first module substrate 111 and second module substrates 112 have been described as lead frame substrates, it is contemplated and understood that, in some examples, first module substrate 111 or second module substrate 112 can comprise another type of substrate, such as a laminate substrate or a pre-formed substrate. Pre-formed substrates can be manufactured prior to attachment to an electronic device and can comprise dielectric layers between respective conductive layers. The conductive layers can comprise, for example, copper and can be formed using an electroplating process. The dielectric layers can be non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such pre-formed substrates can be formed through a semi-additive or modified-semi-additive process.

Figure 2G:
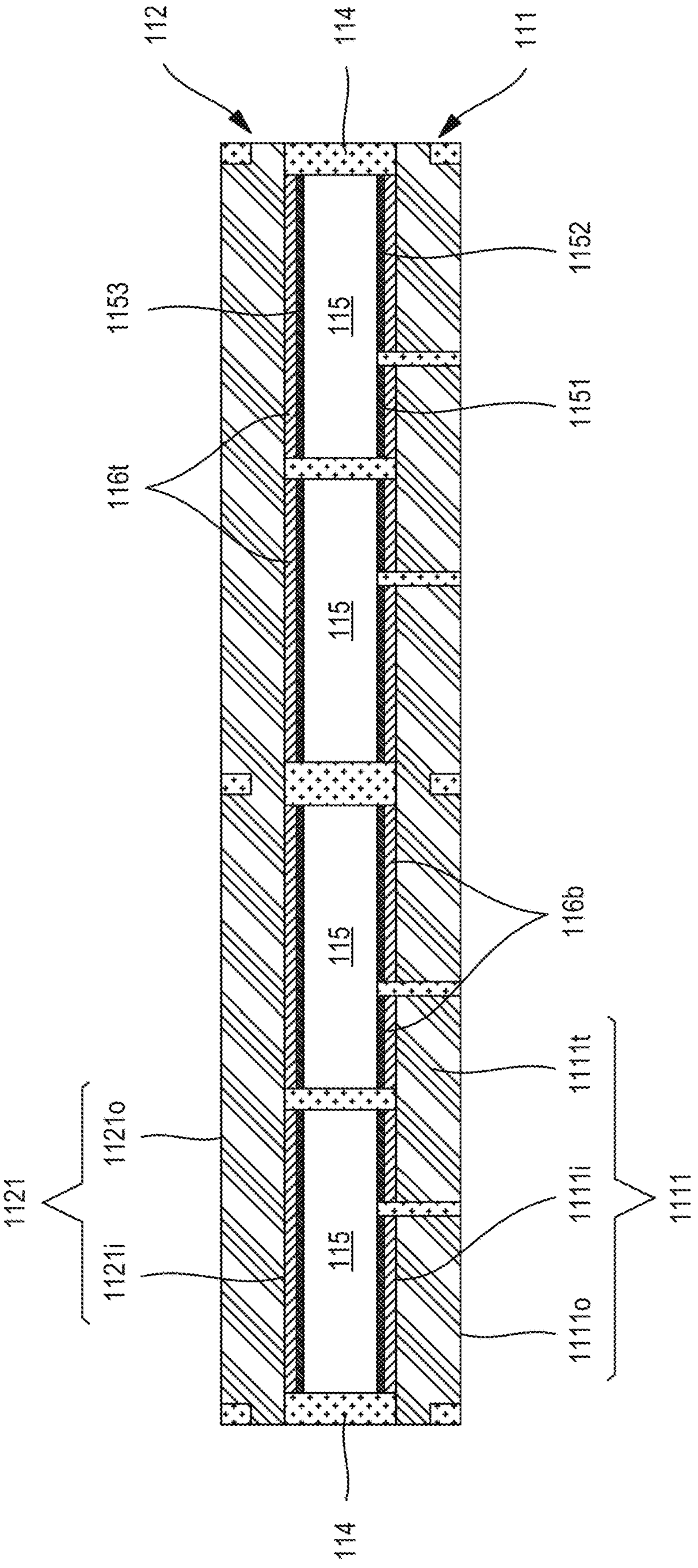

FIG. 2G shows a cross-sectional view of embedded module 11 at a later stage of manufacture. In the example shown in FIG. 2G, module encapsulant 114 can be provided. Module encapsulant 114 can be provided between first module substrate 111 and second module substrate 112. Module encapsulant 114 can encapsulate, surround, or contact lateral sides of module components 115, lateral sides of component terminals 1151, 1152, and 1153, lateral sides of bottom side bonding layer **116*b*, and lateral sides of top side bonding layer 116*t*. In some examples, module encapsulant 114 can contact conductive structure 1111 of first module substrate 111 and conductive structure 1121 of second module substrate 112. In some examples, module encapsulant 114 is laterally interposed between adjacent traces 1111*t* of conductive structure 1111. Module encapsulant 114 can comprise or be referred to as an epoxy mold compound, resin, filler-reinforced polymer, a B-stage pressed film, or gel. In some examples, module encapsulant 114 can be provided by a film assisted molding process, a transfer molding process, or a compression molding process. In some examples, the thickness of module encapsulant 114 can range from about 75 microns to about 450 microns. In some examples, module encapsulant 114 can protect module components 115 from exposure to external factors or environment. In some examples, module encapsulant 114 can be part of, contacted by, or surrounded by device encapsulant 15 (see FIG. 1**A).

In some examples, first module substrate 111, second module substrate 112, module encapsulant 114, and module components 115 can be referred to as embedded module 11. In some examples, embedded module 11 may comprise a power module or an embedded power module. In some examples, the thickness of embedded module 11 can range from about 225 microns to about 950 microns. In some examples, the combined thickness of first module substrate 111, second module substrate 112, and module component 115 (or module encapsulant 114) can be defined as the thickness of embedded module 11. In some examples, outward terminals **1111*o* of first module substrate 111 and outward terminals 1121*o* of second module substrate 112 can be exposed from module encapsulant 114. In some examples, the bottom side of outward terminals 1111*o* of first module substrate 111 can be coplanar with the bottom side of module encapsulant 114. In some examples, the top side of outward terminals 1121*o* of second module substrate 112 can be coplanar with the top side of module encapsulant 114**.

Figure 2H:
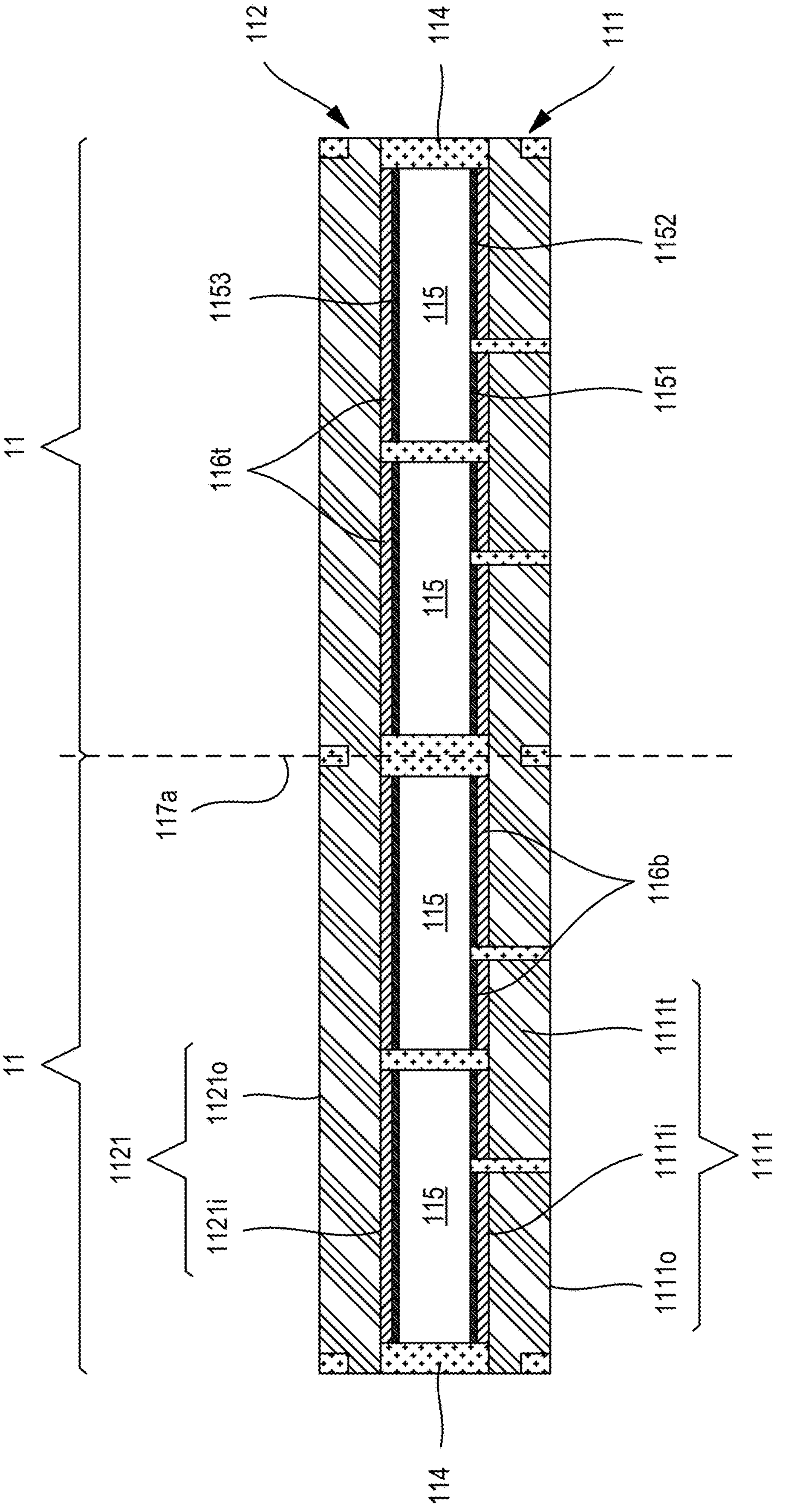

FIG. 2H shows a cross-sectional view of embedded module 11 at a later stage of manufacture. In the example shown in FIG. 2H, a singulation process can be performed. After the encapsulation process is completed, individual embedded modules 11 can be separated (i.e., singulated) by singulating along singulation lines **117*a* located between adjacent embedded modules. In some examples, during the singulation process, a sawing tool, such as a diamond blade wheel or a laser beam, can be used to saw through first module substrate 111, module encapsulant 114, and second module substrate 112 to provide individual embedded modules 11. In some examples, the singulation process provides the lateral sides of first module substrate 111, module encapsulant 114, and second module substrate 112** in a coplanar configuration.

Figures 3A, 3B:
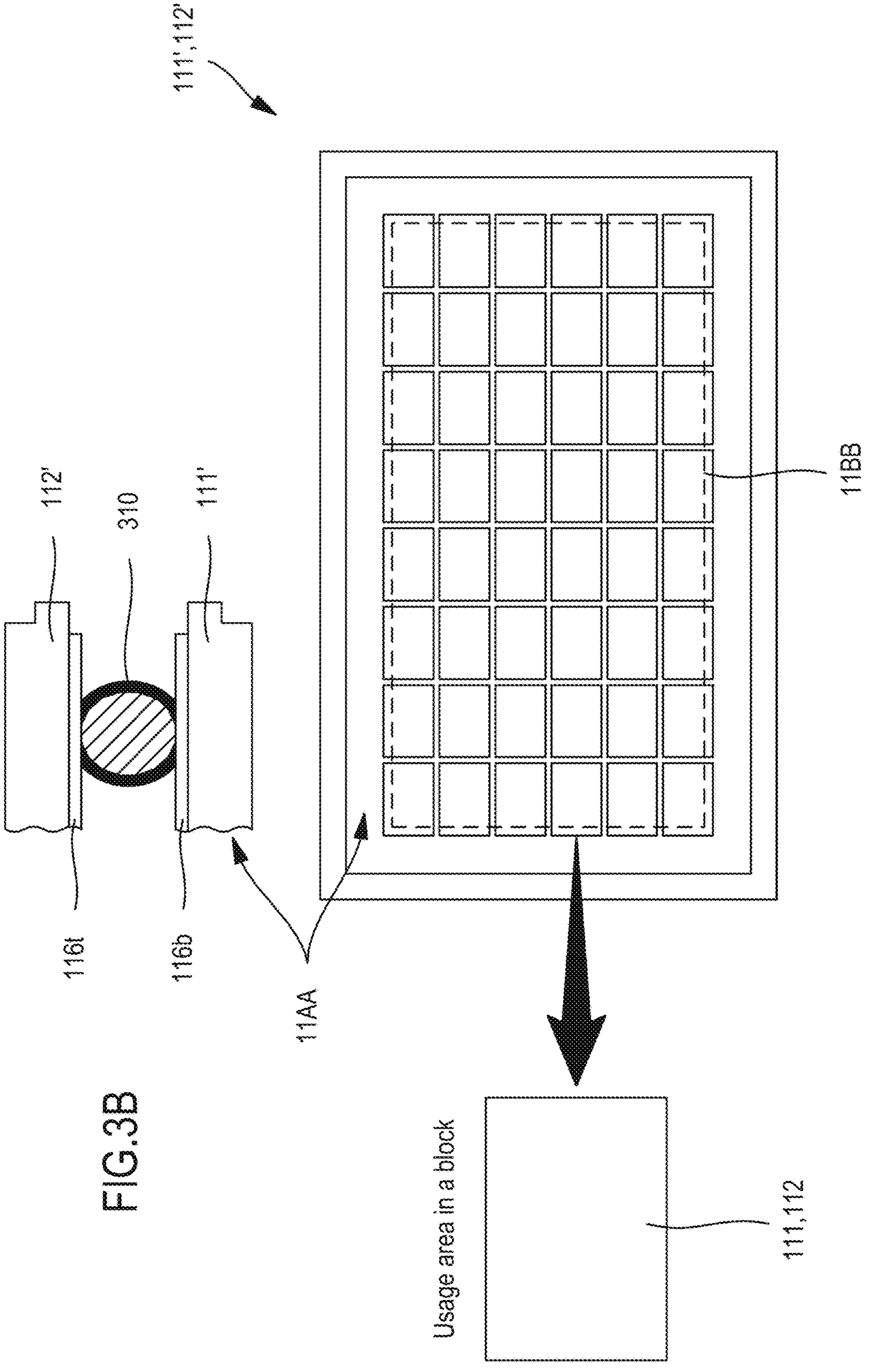
FIG. 3A shows a top view of an example module substrate.
FIG. 3B shows a partial cross-sectional view of a perimeter portion of example module substrates with an optional spacer.

FIG. 3A shows a top view of an example module substrate panel 111' or 112'. In the example shown in FIG. 3A, module substrate panel 111' or 112' can comprise first module substrate unit 111 or second module substrate unit 112. To achieve high production yield, module substrate unit 111 or 112 can have rows and columns and can be provided in a matrix form. As described above, in the sintering process according to the present disclosure, since there is almost no change in the thickness of the bonding layer (e.g., bonding layer **116*b* and bonding layer 116*t*), it is not necessary to place spacers between first module substrate 111 and second module substrate 112 during the sintering process, and thus the area used to manufacture embedded module 11 in the module substrate 111 or 112 can be increased. In some examples, more embedded modules 11 than in the prior art can be provided within module substrate panel 111' or 112' of the same size. In accordance with the present description, module substrate panel 112' or module substrate panel 111' can be coupled to module components 115 devoid of or absent any spacers as used in previous module devices. Such spacers include, but are not limited to, copper core solder balls. In some examples as shown in the partial cross-sectional view of FIG. 3B, spacers 310 can be used only around the perimeter 11**AA of the module substrate panels with the internal portions 11BB devoid of any spacers. Both approaches increase the usable area of the module substrate panels, reduce the use of piece parts including spacers, and avoid additional processing steps and associated costs required to place the spacers onto the module substrate panels. When spacers are used on the perimeter 11AA of the module substrate panels only, less spacers are required and placing the spacers onto the internal portion 11BB of the module substrate panels is avoided allowing the module components to be placed closer together.

Figure 4A:
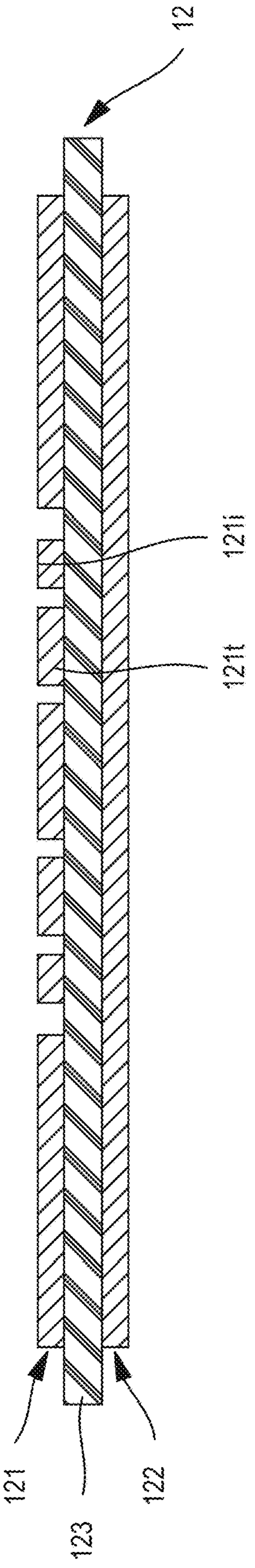
FIGS. 4A, 4B, 4C, 4D, 4E, 4F, and 4G show cross-sectional views of an example method for manufacturing an example electronic device.

FIGS. 4A, 4B, 4C, 4D, 4E, 4F, and 4G show cross-sectional views of an example method for manufacturing an example electronic device, such as electronic device 1 shown in FIG. 1A. FIG. 4A shows a cross-sectional view of electronic device 1 at an early stage of manufacture.

In the example shown in FIG. 4A, device substrate 12 can be provided. Device substrate 12 can comprise or be referred to as a direct bonded copper substrate, a direct plated copper substrate, a thermal dissipation substrate, a ceramic substrate, or active metal brazing (AMB). In some examples, device substrate 12 is configured to support embedded module 11 and device terminals 14 (FIG. 1A). In some examples, device substrate 12 can transfer or dissipate heat generated by embedded module 11 away from embedded module 11 and to a lower portion of electronic device 1. In some examples, the thickness of device substrate 12 can range from about 650 microns to about 2600 microns. The area (or footprint) of device substrate 12 can be larger than the area (or footprint) of embedded module(s) 11. Device substrate 12 can comprise inward metallic layer 121, outward metallic layer 122, and core layer 123.

Inward metallic layer 121 can comprise or be referred to as metallic planes, metallic paths, leads, terminals, pads, or traces. Inward metallic layer 121 can comprise a metal such as, for example, copper, aluminum, palladium, titanium, tungsten, titanium/tungsten, nickel, gold, or silver. Inward metallic layer 121 can be provided on the top side of core layer 123. In some examples, the thickness of inward metallic layer 121 can range from about 200 microns to about 800 microns.

Inward metallic layer 121 can be coupled to core layer 123 and can be formed by covering the entire top side of core layer 123 and then etching or removing a portion of inward metallic layer 121 to form inward terminals 121*i* and traces 121*t* over the top side of core layer 123. In some examples, inward terminals 121*i* can have a plating (e.g., Sn) on a top side and lateral sides. Traces 121*t* can extend to and contact inward terminals 121*i* or device terminal 14 (FIG. 1A).

Outward metallic layer 122 can comprise or be referred to as metallic planes, metallic paths, leads, terminals, pads, or traces. Outward metallic layer 122 can comprise a metal, such as for example, copper, aluminum, palladium, titanium, tungsten, titanium/tungsten, nickel, gold, or silver. Outward metallic layer 122 can be provided on the bottom side of core layer 123. In some examples, outward metallic layer 122 can be formed by covering the entire bottom side of core layer 123. In some examples, outward metallic layer 122 can transfer or dissipate heat generated by embedded module 11 to a lower portion of electronic device 1. In some examples, the thickness of outward metallic layer 122 can range from about 200 microns to about 800 microns.

Core layer 123 can comprise or be referred to as a ceramic, a thermal conductive material, or a dielectric. Core layer 123 can support inward metallic layer 121 and outward metallic layer 122. In some examples, core layer 123 can transfer heat generated from embedded module 11 to outward metallic layer 122. In some examples, the area (or footprint) of core layer 123 can be larger than the area (or footprint) of inward metallic layer 121 or than the area (or footprint) of outward metallic layer 122. In some examples, the thickness of core layer 123 can range from about 250 microns to about 1000 microns. In some examples, a portion of inward metallic layer 121 and a portion of outward metallic layer 122 can be coupled to each other by one or more conductive via(s) extending through core layer 123.

Figure 4B:
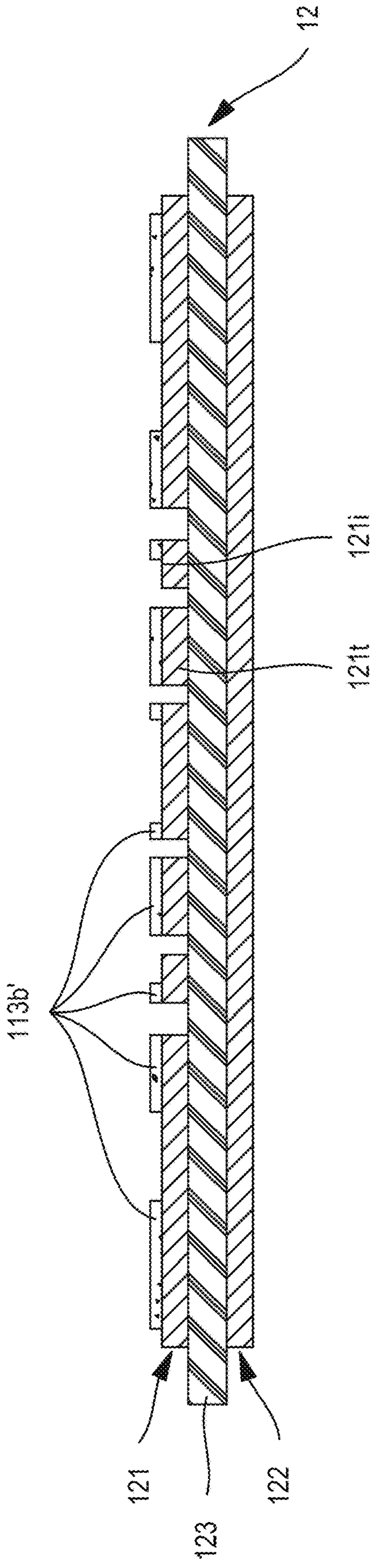

FIG. 4B shows a cross-sectional view of electronic device 1 at a later stage of manufacture. In the example shown in FIG. 4B, bottom side conductive adhesive 113*b*' can be provided. Bottom side conductive adhesive 113*b*' can be provided on the top side of inward metallic layer 121. In some examples, bottom side conductive adhesive 113*b*' can be provided on the area of inward metallic layer 121 where embedded modules 11 or device terminals 14 will be electrically coupled to device substrate 12. In some examples, bottom side conductive adhesive 113*b*' can comprise or be referred to as a solder material or sintering material. In some examples, bottom side conductive adhesive 113*b*' can comprise Sn, Ag, Pb, Cu, Sn—Pb, Sn37Pb, Sn95-Pb, Sn—Pb—Ag, Sn—Cu, Sn—Ag, Sn—Au, Sn—Bi, or Sn—Ag—Cu. In some examples, bottom side conductive adhesive 113*b*' can comprise the sintering material described above for bottom side bonding layer 116*b* for embedded module 11. In some examples, bottom side conductive adhesive 113*b*' can be provided by coating methods such as doctor blade coating, casting, painting, spray coating, slot die coating, curtain coating, slide coating or knife over edge coating, printing methods such as screen printing, pad printing or gravure printing, using an intermediate technology between coating and printing, such as flexographic printing, offset printing or inkjet printing, or directly attaching a conductive adhesive film or a conductive adhesive tape on the top side of inward metallic layer 121.

Figure 4C:
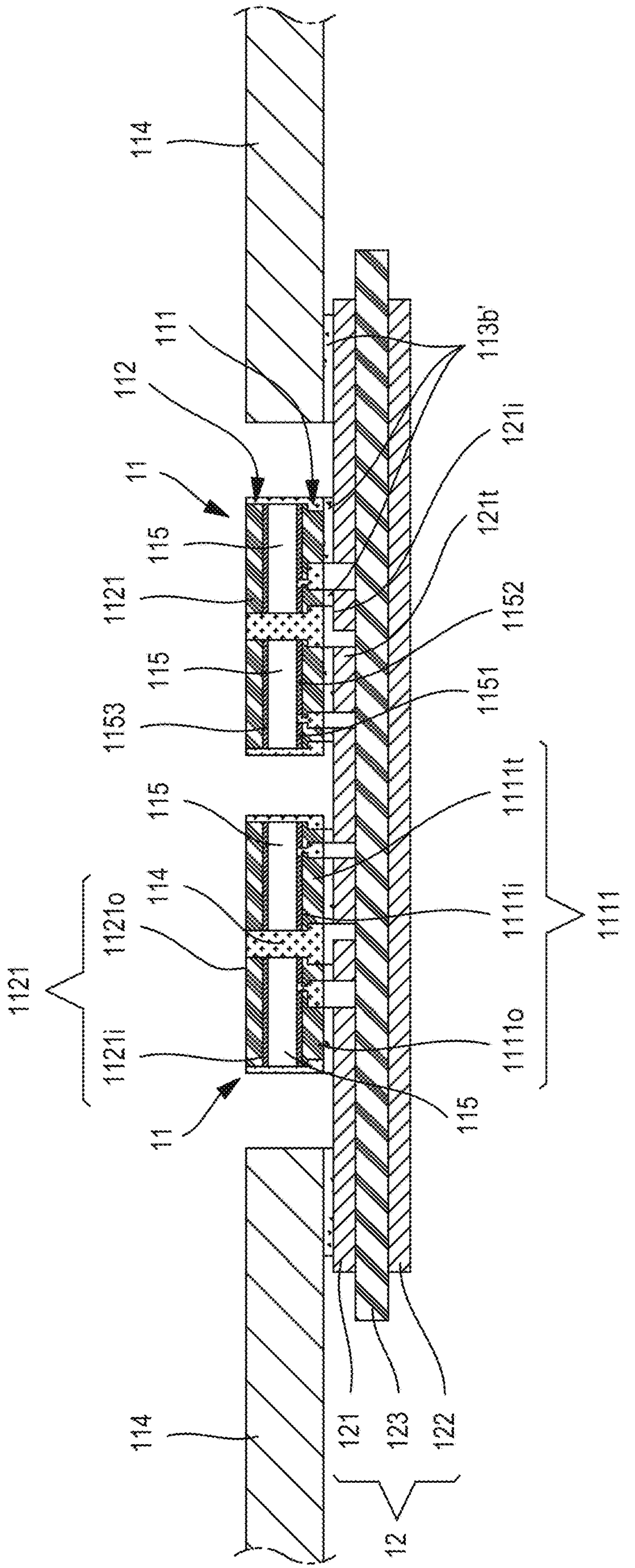

FIG. 4C shows a cross-sectional view of electronic device 1 at a later stage of manufacture. In the example shown in FIG. 4C, embedded modules 11 and device terminals 14 can be provided on device substrate 12. Embedded modules 11 can be coupled to device substrate 12 through bottom side conductive adhesive 113*b*'. In some examples, conductive structure 1111 (e.g., outward terminals 1111*o*) of first module substrate 111 can be coupled to inward metallic layer 121 (e.g., inward terminals 121*i*) of device substrate 12 through bottom side conductive adhesive 113*b*'. In some examples, device substrate 12 can couple embedded modules 11 to device terminals 14 or to each other. For example, inward metallic layer 121 can couple embedded modules 11 to device terminals 14. In some examples, inward metallic layer 121 can transfer signals from embedded modules 11 to device terminals 14 or can transfer signals received by device terminals 14 to embedded modules 11. Device terminals 14 can be spaced apart from each other and can be mounted on the outer edge or perimeter of device substrate 12. Device terminals 14 can be coupled to inward metallic layer 121 (e.g., inward terminals 121*i* or traces 121*t*) of device substrate 12 through bottom side conductive adhesive 113*b*'. Device terminals 14 can protrude outward of device substrate 12. In some examples, device terminals 14 can be spaced apart from embedded modules 11 and can be provided outside or external to embedded modules 11. In some examples, device terminals 14 can comprise or be referred to as leads, lead frames, or legs. In some examples, device terminals 14 can comprise copper, a copper alloy, nickel, a nickel alloy, iron, or an iron-nickel alloy. In some examples, the thicknesses of device terminals 14 can range from about 125 microns to about 800 microns. Device terminals 14 can be provided as an electrical contact between electronic device 1 and an external component.

In accordance with various examples, after embedded modules 11 and device terminals 14 are mounted on device substrate 12, a bonding process can be performed to couple embedded modules 11 and device terminals 14 to device substrate 12. In some examples, embedded modules 11 and device terminals 14 can be coupled to device substrate 12 using, for example, a reflowing process or sintering process. In some examples, the reflowing process can comprise providing the solder material on device substrate 12 as described above and then providing a heat source, such as hot air infrared or a laser beam, to melt the solder material, thereby allowing embedded modules 11 and device terminals 14 to be electrically coupled to device substrate 12. In some examples, the sintering process can comprise providing the sintering material on the device substrate 12 as described above and then providing a heat source to sinter the sintering material, thereby allowing embedded modules 11 and device terminals 14 to be electrically coupled on device substrate 12. The sintering process described here can be similar to the sintering process described in the manufacturing process of embedded module 11 described above.

Figure 4D:
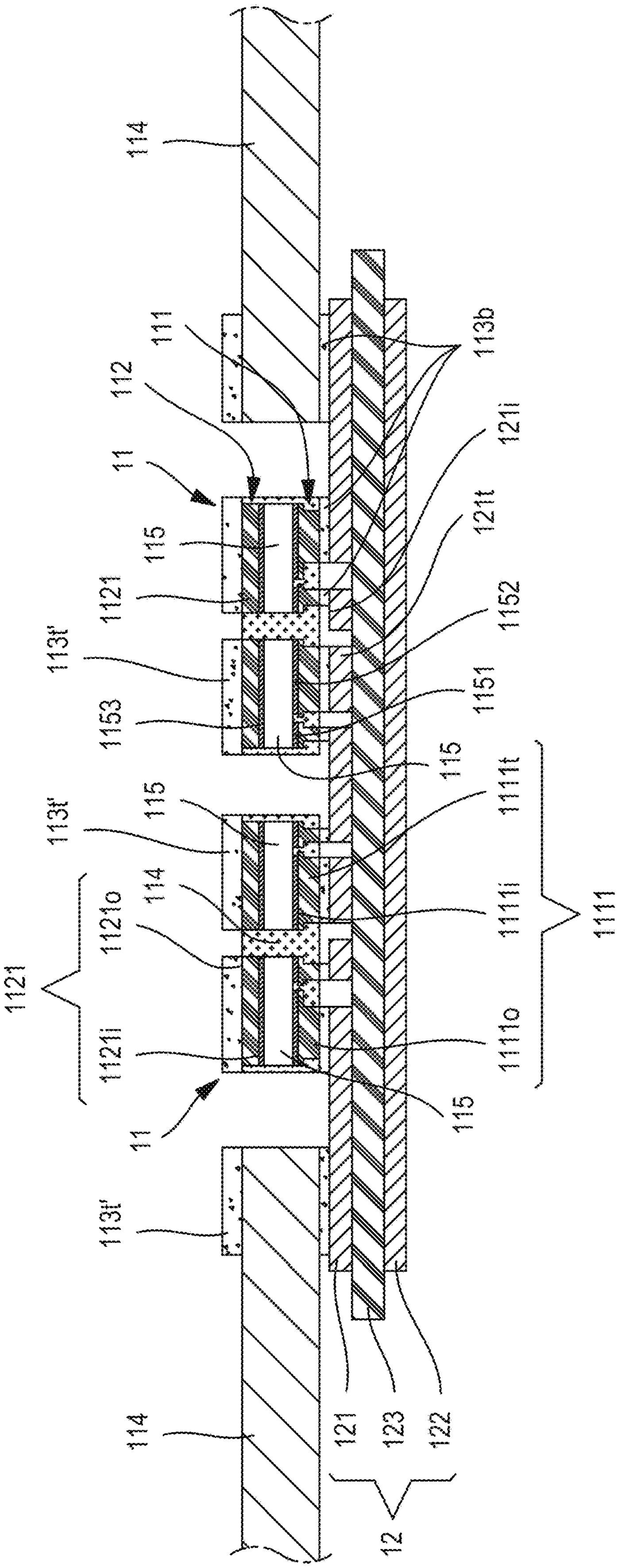

FIG. 4D shows a cross-sectional view of electronic device 1 at a later stage of manufacture. In the example shown in FIG. 4D, top side conductive adhesive 113*t*' can be provided. In some examples, top side conductive adhesive 113*t*' can be provided on the top side of embedded modules 11 and device terminals 14. In some examples, top side conductive adhesive 113*t*' can be provided on second module substrate 112 of embedded module 11. In some examples, top side conductive adhesive 113*t*' can be provided on conductive structure 1121 of second module substrate 112. In some examples, top side conductive adhesive 113*t*' can be provided on outward terminal 1121*o* of conductive structure 1121. Top side conductive adhesive 113*t*' can also be provided on the top side of device terminals 14. In some examples, the material and method of providing top side conductive adhesive 113*t*' can be similar to the material and method of providing bottom side conductive adhesive 113*b*' described above.

Figure 4E:
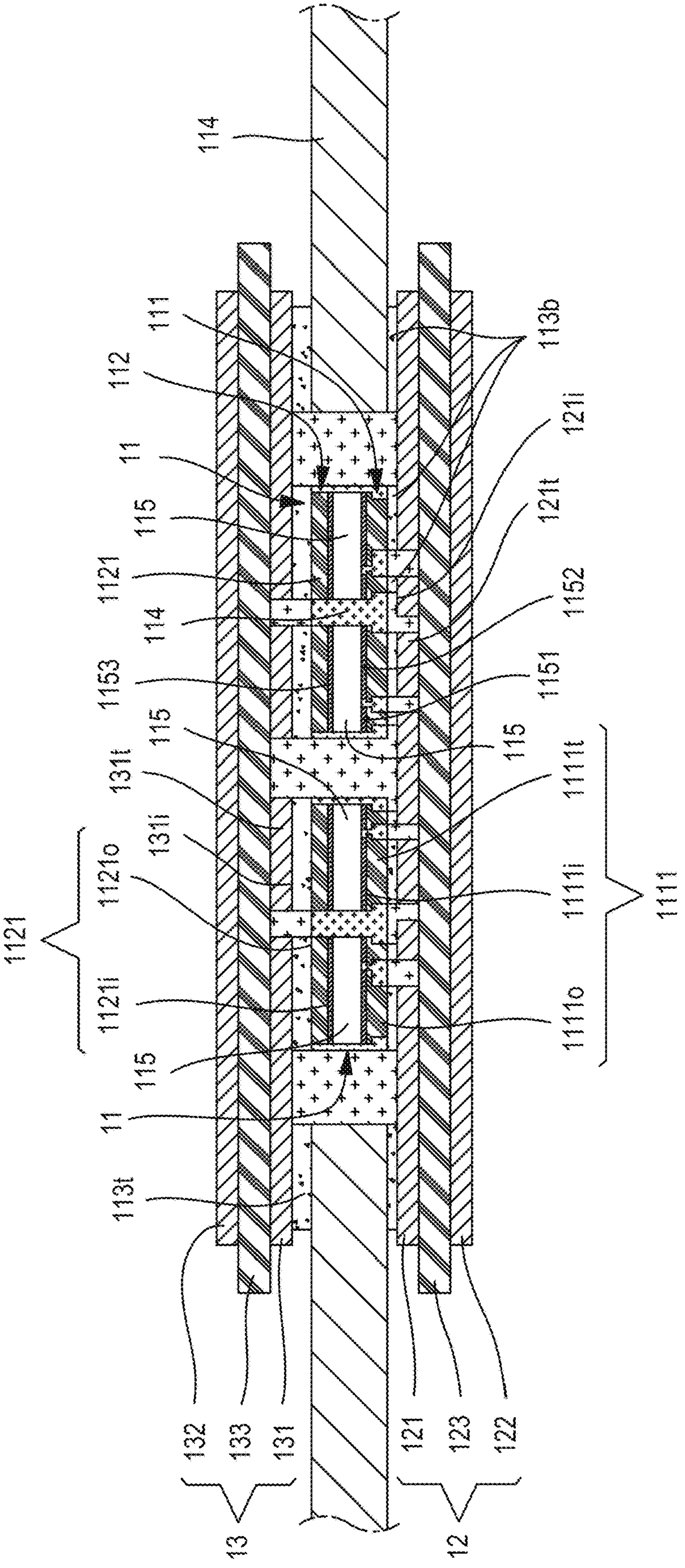

FIG. 4E shows a cross-sectional view of electronic device 1 at a later stage of manufacture. In the example shown in FIG. 4E, device substrate 13 can be provided on embedded modules 11 and device terminals 14. In some examples, device substrate 13 can be disposed on second module substrate 112 of embedded module 11 through top side conductive adhesive 113*t*' and the top side of device terminal 14 through top side conductive adhesive 113*t*'. In some examples, device substrate 13 can be coupled to embedded modules 11 and to device terminals 14.

In some examples, device substrate 13 can comprise or be referred to as a direct bonded copper substrate, a direct plated copper substrate, a thermal dissipation substrate, a ceramic substrate, or AMB. In some examples, device substrate 13 can transfer or dissipate heat generated by embedded modules 11 to a top portion of electronic device 1 or device terminals 14. In some examples, the thickness of device substrate 13 can range from about 650 microns to about 2600 microns. In some examples, the area (or footprint) of device substrate 13 can be the same as, larger than, or smaller than the area (or footprint) of device substrate 12. Device substrate 13 can comprise inward metallic layer 131, outward metallic layer 132, and core layer 133.

Inward metallic layer 131 can comprise or be referred to as metallic planes, metallic paths, leads, terminals, pads, or traces. Inward metallic layer 131 can comprise a metal, such as, for example, copper, aluminum, palladium, titanium, tungsten, titanium/tungsten, nickel, gold, or silver. Inward metallic layer 131 can be provided on the bottom side of core layer 133. In some examples, inward metallic layer 131 can be coupled to conductive structure 1121 (e.g., outward terminals 1121*o*) of second module substrate 112 and top side of device terminal 14. In some examples, the thickness of inward metallic layer 131 can range from about 200 microns to about 800 microns.

In some examples, inward metallic layer 131 can be formed by covering the entire bottom side of core layer 133 and then etching or removing a portion of inward metallic layer 131 to form inward terminals 131*i* and traces 131*t* over the bottom side of core layer 133. Inward terminals 131*i* can be coupled to outward terminals 1121*o* of second module substrate 112. In some examples, inward terminals 131*i* can have a plating. Traces 131*t* can extend to and contact inward terminals 131*i* or device terminal 14.

In some examples, outward metallic layer 132 can comprise or be referred to as metallic planes, metallic paths, leads, terminals, pads, or traces. Outward metallic layer 132 can comprise a metal such as, for example, copper, aluminum, palladium, titanium, tungsten, titanium/tungsten, nickel, gold, or silver. Outward metallic layer 132 can be provided on the top side of core layer 133. In some examples, outward metallic layer 132 can cover the entire top side of core layer 133. In some examples, outward metallic layer 132 can transfer or dissipate heat generated from embedded modules 11 to a top portion of electronic device 1. In some examples, the thickness of outward metallic layer 132 can range from about 200 microns to about 800 microns.

In some examples, core layer 133 can comprise or be referred to as a ceramic, a thermal conductive material, or a dielectric. Core layer 133 can support inward metallic layer 131 and outward metallic layer 132. In some examples, core layer 133 can transfer heat generated from embedded module 11 to outward metallic layer 132. In some examples, the area (or footprint) of core layer 133 can be larger than the area (or footprint) of inward metallic layer 131 or outward metallic layer 132. In some examples, the thickness of core layer 133 can range from about 250 microns to about 1000 microns. In some examples, a portion of inward metallic layer 131 and a portion of outward metallic layer 132 can be coupled to each other by one or more conductive vias extending through core layer 133.

In accordance with various examples, after device substrate 13 is provided on embedded module 11 and device terminal 14, a bonding process can be performed to couple device substrate 13 to embedded module 11 and device terminal 14. In some examples, device substrate 13 can be coupled to embedded module 11 and device terminal 14 by reflowing process or sintering process. In some examples, the reflowing process or sintering process can be similar to the process(es) described in FIG. 4C.

Figure 4F:
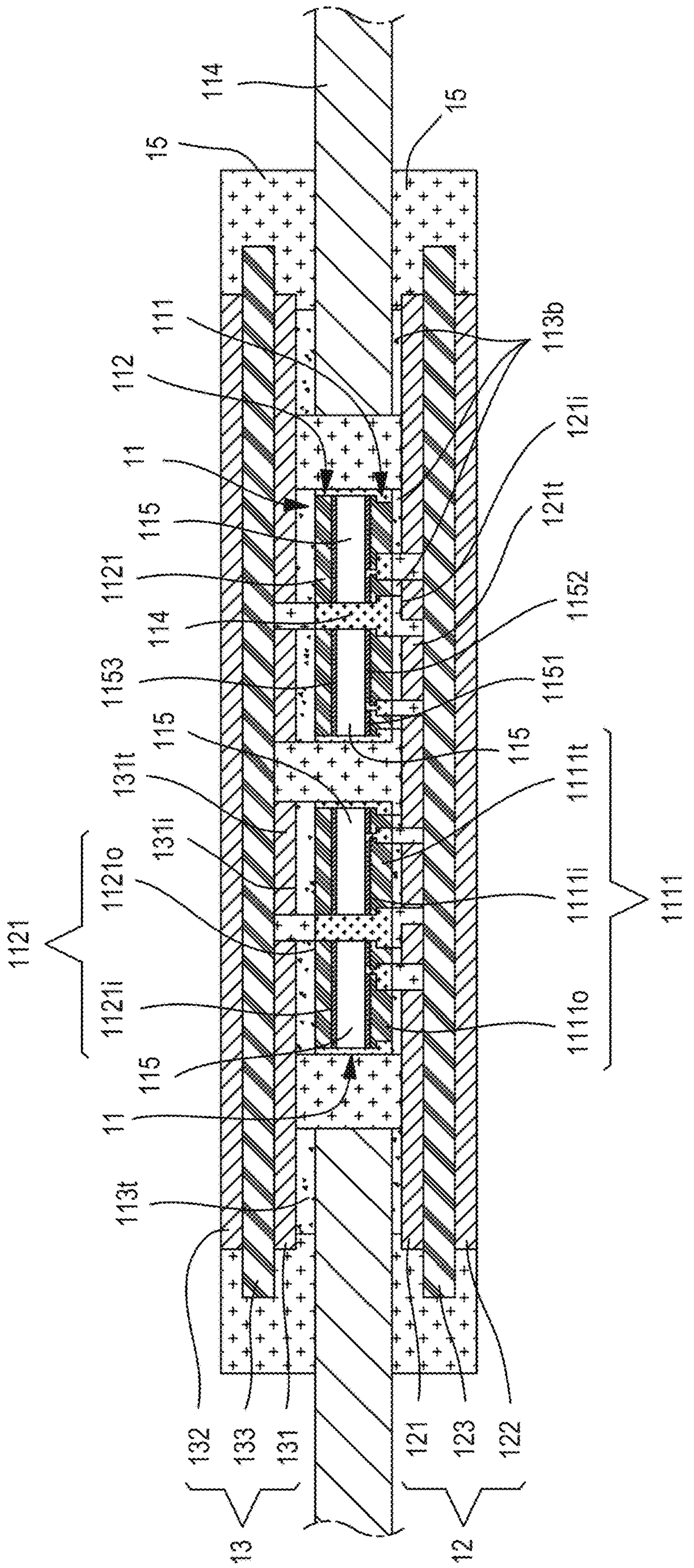

FIG. 4F shows a cross-sectional view of electronic device 1 at a later stage of manufacture. In the example shown in FIG. 4F, device encapsulant 15 can be provided. Device encapsulant 15 can encapsulate embedded modules 11, device substrates 12 and 13, and device terminals 14. Portions of device terminals 14 can extend from or be exposed from device encapsulant 15. For example, device terminals 14 can protrude outward of device encapsulant 15. In some examples, outward metallic layer 122 of device substrate 12 and outward metallic layer 132 of device substrate 13 can be exposed from device encapsulant 15. In some examples, the top side of device encapsulant 15 can be coplanar with outward metallic layer 132, and the bottom side of device encapsulant 15 can be coplanar with outward metallic layer 122.

In some examples, device encapsulant 15 can comprise or be referred to as a resin, a polymer with fillers, a mold compound, a protective material, or a mold material. In some examples, device encapsulant 15 can be provided by a film assisted molding process, a compression molding process, or a transfer molding process. In some examples, the height (or thickness) of device encapsulant 15 can range from about 1650 microns to about 6350 microns. The thickness of device encapsulant 15 can be defined as the thickness of electronic device 1. In some examples, device encapsulant 15 can protect embedded modules 11 from exposure to external factors or environments.

Figure 4G:
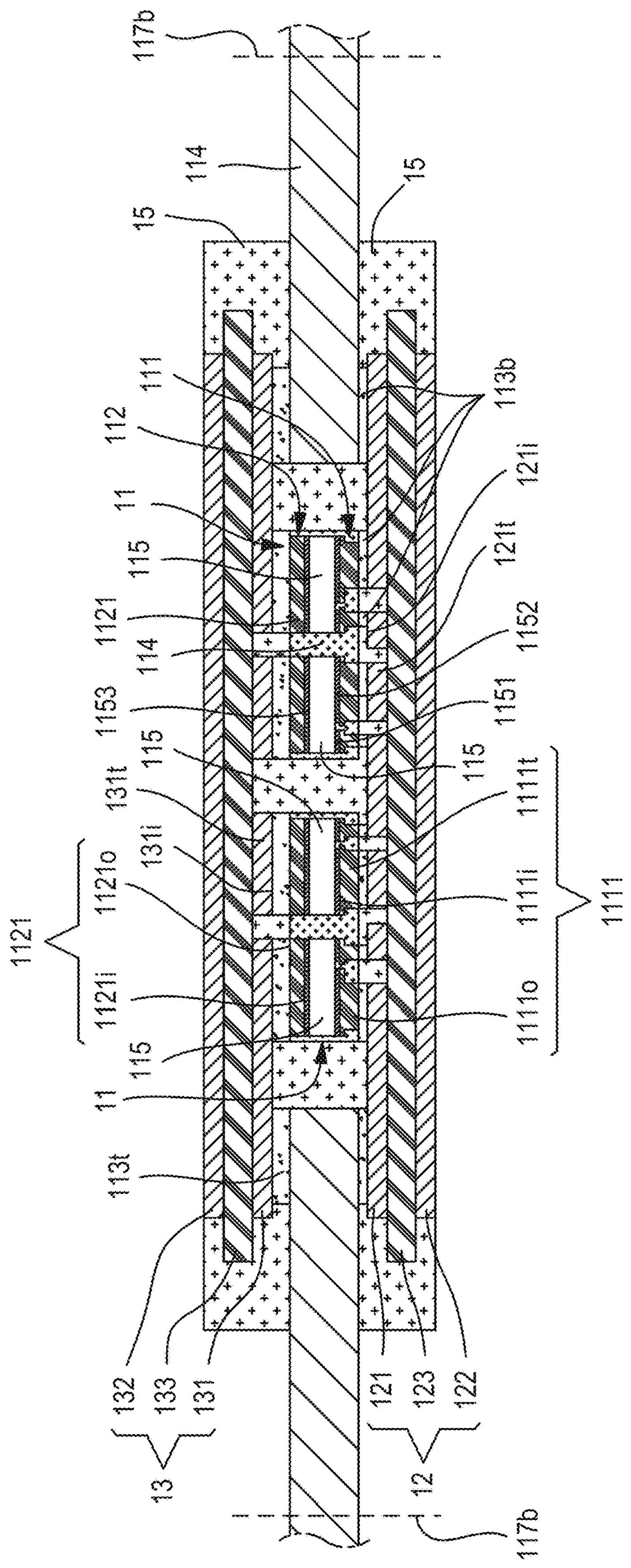

FIG. 4G shows a cross-sectional view of electronic device 1 at a later stage of manufacture. In the example shown in FIG. 4G, a singulation process can be performed. In some examples, individual electronic devices 1 can be separated (i.e., singulated) by singulating along singulation lines 117*b* in a matrix-type or strip-type leadframe. In some examples, a sawing tool, such as a diamond blade wheel or a laser beam, can be used in the singulating process. In some examples, during singulation, device terminals 14 can be severed and separated into individual electronic devices 1.

In summary, structures and associated methods that relate to packaged electronic devices with improved reliability and manufacturability have been disclosed herein. More particularly, structures and methods have been described the improved the manufacturability of packaged electronic devices that use embedded modules with module components attached to module substrates without the use of or with a reduced number of spacers when manufactured in a multiple module substrate matrix format. In some examples, the avoidance or reduction in use of spacers is facilitated by an attachment process that reduces the movement of the module substrates during bonding. In some examples, a sintering material comprising a solder material and metal particles is used for the attachment process, which was found through experimentation to maintain a more uniform bond thickness and planarity during sintering compared to prior reflow processes. By eliminating or reducing the use of spacers, higher density packaging can be achieved, manufacturing costs are reduced, manufacturing cycle time and efficiencies are improved, and higher power densities are achieved. In some examples, the module substrates are coupled to device terminals and conductive substrates are coupled to opposing sides of the embedded module. In some examples, the device terminals can comprise a leadframe. In some examples, the conductive substrates can be thermally conductive. In some examples, the conductive substrates can be thermally and electrically conducting.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claimed is:

1. An electronic device, comprising:

a first embedded module comprising:

a first module component comprising a first module component first side, a first module component second side opposite to the first module component first side, a first module component lateral side, a first component terminal adjacent to the first module component first side, and a second component terminal adjacent to the first module component second side;

a first module substrate coupled to the first component terminal with a first bonding layer;

a second module substrate coupled to the second component terminal with a second bonding layer; and a first module encapsulant encapsulating the first module component, portions of the first module substrate, and portions of second module substrate;

a first device substrate coupled to the first module substrate;

a second device substrate coupled to the second module substrate;

device terminals coupled to the first module component; and a device encapsulant encapsulating the first embedded module, the device terminals, the first device substrate, and the second device substrate;

wherein:

the first bonding layer comprises a first sintering material;

the second bonding layer comprises a second sintering material;

a portion of the first device substrate is exposed from the device encapsulant; and portions of the device terminals are exposed from the device encapsulant.

2. The electronic device of claim 1, wherein:

the first sintering material comprises a first solder material and first metal particles; and a weight ratio of the first solder material to the first metal particles is a range from about 1:3 to about 1:10.

3. The electronic device of claim 2, wherein:

the second sintering material comprises a second solder material and second metal particles.

4. The electronic device of claim 2, wherein:

the first metal particles comprise a particle size in a range from about 1 nanometer to about 10 microns.

5. The electronic device of claim 4, wherein:

the first metal particles comprise one or more of silver, gold, copper, nickel, or aluminum.

6. The electronic device of claim 2, wherein:

the first solder material comprises a Sn-based solder.

7. The electronic device of claim 1, wherein:

the first module encapsulant comprises a first side and a second side opposite to the first side;

the first module encapsulant encapsulates the first module component lateral side, portions of the first component terminal, portions of the first bonding layer, portions of the second component terminal, and portions of the second bonding layer;

a portion of the first module substrate is exposed from the first side of the first module encapsulant; and a portion of the second module substrate is exposed from the second side of the first module encapsulant.

8. The electronic device of claim 1, wherein:

the first module substrate comprises a first lead frame substrate.

9. The electronic device of claim 8, wherein:

the second module substrate comprises a second lead frame substrate.

10. The electronic device of claim 1, further comprising:

a second module component comprising second module component first side, a second module component second side opposite to the second module component first side, a second module component lateral side, a third component terminal adjacent to the second module component first side, and a fourth component terminal adjacent to the second module component second side;

wherein:

the first module encapsulant encapsulates the second module component including the second module component lateral side.

11. The electronic device of claim 1, wherein:

the first embedded module is devoid of spacers extending between the first module substrate and the second module substrate.

12. An electronic device, comprising:

an embedded module comprising:

a first module component comprising a first module component first side, a first module component second side opposite to the first module component first side, a first component lateral side, a first component terminal adjacent to the first module component first side, and a second component terminal adjacent to the first module component second side;

a first lead frame substrate coupled to the first component terminal with a first bonding layer;

a second lead frame substrate coupled to the second component terminal with a second bonding layer; and a module encapsulant encapsulating the first module component, portions of the first lead frame substrate, and portions of second lead frame substrate;

a first device substrate coupled to the first lead frame substrate;

a second device substrate coupled to the second lead frame substrate;

device terminals coupled to the first module component; and a device encapsulant encapsulating the embedded module, the device terminals, the first device substrate, the second device substrate;

wherein:

the first bonding layer comprises a first sintering material comprising:

a first solder material; and first metal particles.

13. The electronic device of claim 12, wherein:

the first metal particles comprise one or more of silver, gold, copper, nickel, or aluminum; and a weight ratio of the first solder material to the first metal particles is greater than about 1:2.5.

14. The electronic device of claim 12, wherein the first bonding layer comprises an intermetallic compound comprising a weight percent (wt %) of the intermetallic compound greater than 50 wt %.

15. The electronic device of claim 14, wherein:

the intermetallic compound is uniformly distributed throughout the first bonding layer.

16. The electronic device of claim 12, wherein:

the embedded module is devoid of any spacers.

17. The electronic device of claim 12, wherein:

the second bonding layer comprises the first sintering material.

18. A method of manufacturing an electronic device, comprising:

providing an embedded module comprising:

a first module component comprising a first module component first side, a first module component second side opposite to the first module component first side, a first component lateral side, a first component terminal adjacent to the first module component first side, and a second component terminal adjacent to the first module component second side;

a first lead frame substrate coupled to the first component terminal with a first bonding layer;

a second lead frame substrate coupled to the second component terminal with a second bonding layer; and a module encapsulant encapsulating the first module component, portions of the first lead frame substrate, and portions of second lead frame substrate;

providing a first device substrate coupled to the first lead frame substrate;

providing a second device substrate coupled to the second lead frame substrate;

providing device terminals coupled to the first module component; and providing a device encapsulant encapsulating the embedded module, the device terminals, the first device substrate, the second device substrate;

wherein:

the first bonding layer comprises a first sintering material; and the second bonding layer comprises a second sintering material.

19. The method of claim 18, wherein providing the embedded module comprises:

providing the first sintering material comprising a first solder material and first metal particles;

providing the second sintering material comprising a second solder material and second metal particles;

attaching the first lead frame substrate to the first component terminal with the first sintering material;

attaching the second lead frame substrate to the second component terminal with the second sintering material;

exposing the first sintering material to an elevated temperature to react the first solder material and the first metal particles to form a first intermetallic compound; and exposing the second sintering material to the elevated temperature to react the second solder material and the second metal particles to form a second intermetallic compound.

20. The method of claim 19, wherein:

the elevated temperature is in a range from about 150° C. to about 300° C.; and exposing the first sintering material and exposing the second sintering material are done without using a spacer between the first lead frame substrate and the second lead frame substrate.

* * * * *